US008536574B2

(12) United States Patent
Kim et al.

(10) Patent No.: US 8,536,574 B2
(45) Date of Patent: Sep. 17, 2013

(54) THIN FILM TRANSISTOR AND METHOD OF MANUFACTURING THE SAME

(75) Inventors: Swae-Hyun Kim, Ansan-si (KR); Jeong-Ho Lee, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 379 days.

(21) Appl. No.: 12/884,999

(22) Filed: Sep. 17, 2010

(65) Prior Publication Data

US 2011/0254005 A1 Oct. 20, 2011

(30) Foreign Application Priority Data

Apr. 16, 2010 (KR) ........................ 10-2010-0035518

(51) Int. Cl.
*H01L 31/04* (2006.01)

(52) U.S. Cl.
USPC ................................................ 257/57; 438/34

(58) Field of Classification Search
USPC ......... 257/47, 59, E33.053, E33.001; 438/34
See application file for complete search history.

(56) References Cited

U.S. PATENT DOCUMENTS 6,057,896 A * 5/2000 Rho et al. ......................... 349/42
7,230,668 B2 * 6/2007 Lee et al. ....................... 349/152

FOREIGN PATENT DOCUMENTS

| | | |
|---|---|---|
| JP | 08-254714 | 10/1996 |
| JP | 2001-033826 | 2/2001 |
| JP | 2004-310099 | 11/2004 |
| KR | 1020050001745 | 1/2005 |
| KR | 1020050070446 | 7/2005 |
| KR | 100654569 | 11/2006 |
| KR | 100661725 | 12/2006 |
| KR | 1020070000582 | 1/2007 |
| KR | 1020080000849 | 1/2008 |

* cited by examiner

*Primary Examiner* — Julio J Maldonado
*Assistant Examiner* — Robert Bachner
(74) *Attorney, Agent, or Firm* — H.C. Park & Associates, PLC

(57) ABSTRACT

In an exemplary embodiment, a thin film transistor array panel includes: a substrate; a gate line on the substrate; a gate driver on a peripheral area of the substrate; a gate pad formed on the substrate and connecting the gate line and the gate driver; a gate insulating layer formed on the gate line and the gate pad; a data line formed on the gate insulating layer and including a source electrode and a facing drain electrode; a height controlling member corresponding to the gate pad and formed on the gate insulating layer; a passivation layer on the gate insulating layer, the data line, the drain electrode, the gate pad, and the height controlling member; an insulating layer on the passivation layer; a pixel electrode formed on the insulating layer and connected to the drain electrode; and contact assistants connected to the gate pad and the height controlling member.

22 Claims, 8 Drawing Sheets

THIN FILM TRANSISTOR AND METHOD OF MANUFACTURING THE SAME

CROSS REFERENCE TO RELATED APPLICATION

This application claims priority from and the benefit of Korean Patent Application No. 10-2010-0035518, filed on Apr. 16, 2010, which is hereby incorporated by reference for all purposes as if fully set forth herein.

BACKGROUND OF THE INVENTION

1. Field of the Invention

Exemplary embodiments of the present invention relate to a thin film transistor array panel and a manufacturing method thereof.

2. Discussion of the Background

A liquid crystal display (LCD) is one of the most commonly used flat panel displays. The LCD may include two substrates with electrodes formed thereon and a liquid crystal layer interposed between the two substrates. In the LCD, a voltage is applied to the electrodes to realign liquid crystal molecules of the liquid crystal layer to thereby regulate the transmittance of light passing through the liquid crystal layer.

An LCD may include a liquid crystal panel injected with the liquid crystal between two substrates, a backlight disposed under the liquid crystal panel to be used as a light source, a driver disposed on the edge of the liquid crystal panel to drive the liquid crystal panel, and a printed circuit board (PCB) including a signal controller and a driving voltage generator to apply signals and voltages to the driver.

The driver may include a gate driver and a data driver; however the gate driver may generate contact deterioration due to a step of an organic layer in a contact portion along with the substrate.

The above information disclosed in this Background section is only for enhancement of understanding of the background of the invention and therefore it may contain information that does not form any part of the prior art.

SUMMARY OF THE INVENTION

Accordingly, exemplary embodiments of the present invention provide a thin film transistor array panel that prevents contact deterioration in a contact portion.

Exemplary embodiments of the present invention also provide a method of manufacturing a thin film transistor array that prevents contact deterioration in a contact portion.

Additional features of the invention will be set forth in the description which follows, and in part will be apparent from the description, or may be learned by practice of the invention.

An exemplary embodiment of the present invention discloses a thin film transistor array panel that includes a substrate including a display area and a peripheral area, a gate line formed on the substrate, and a gate driver formed in the peripheral area of the substrate to supply a gate signal to the gate line. A gate pad is formed on the substrate and connects the gate line and the gate driver. A gate insulating layer is formed on the gate line and the gate pad. A data line is formed on the gate insulating layer and includes a source electrode and a drain electrode facing the source electrode. A height controlling member corresponding to the gate pad is formed on the gate insulating layer. A passivation layer is formed on the gate insulating layer, the data line, the drain electrode, the gate pad, and the height controlling member. An insulating layer is formed on the passivation layer, a pixel electrode is formed on the insulating layer and is connected to the drain electrode, and contact assistants are connected to the gate pad and the height controlling member.

An exemplary embodiment of the present invention also discloses a manufacturing method of a thin film transistor array panel that includes: forming a gate line and a gate pad on a substrate; forming a gate insulating layer on the gate line and the gate pad; sequentially forming a first amorphous silicon layer, a second amorphous silicon layer, and a data metal layer on the gate insulating layer; and etching the first amorphous silicon layer, the second amorphous silicon layer, and the data metal layer to form a semiconductor, an ohmic contact layer, a data line including a source electrode and a drain electrode facing the source electrode, and a height controlling member. The method includes sequentially forming a passivation layer and an insulating layer on the gate insulating layer, the data line, the drain electrode, the gate pad, and the height controlling member; etching the gate insulating layer, the passivation layer, and the insulating layer to form a first contact portion exposing the gate pad; and etching the passivation layer and the insulating layer to form a contact hole exposing the drain electrode and a second contact portion exposing the height controlling member. The method includes forming a pixel electrode connected to the drain electrode through the contact hole on the insulating layer and a contact assistant connected to the gate pad through the first contact portion and the height controlling member through the second contact portion, wherein the height controlling member is formed corresponding to the gate pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
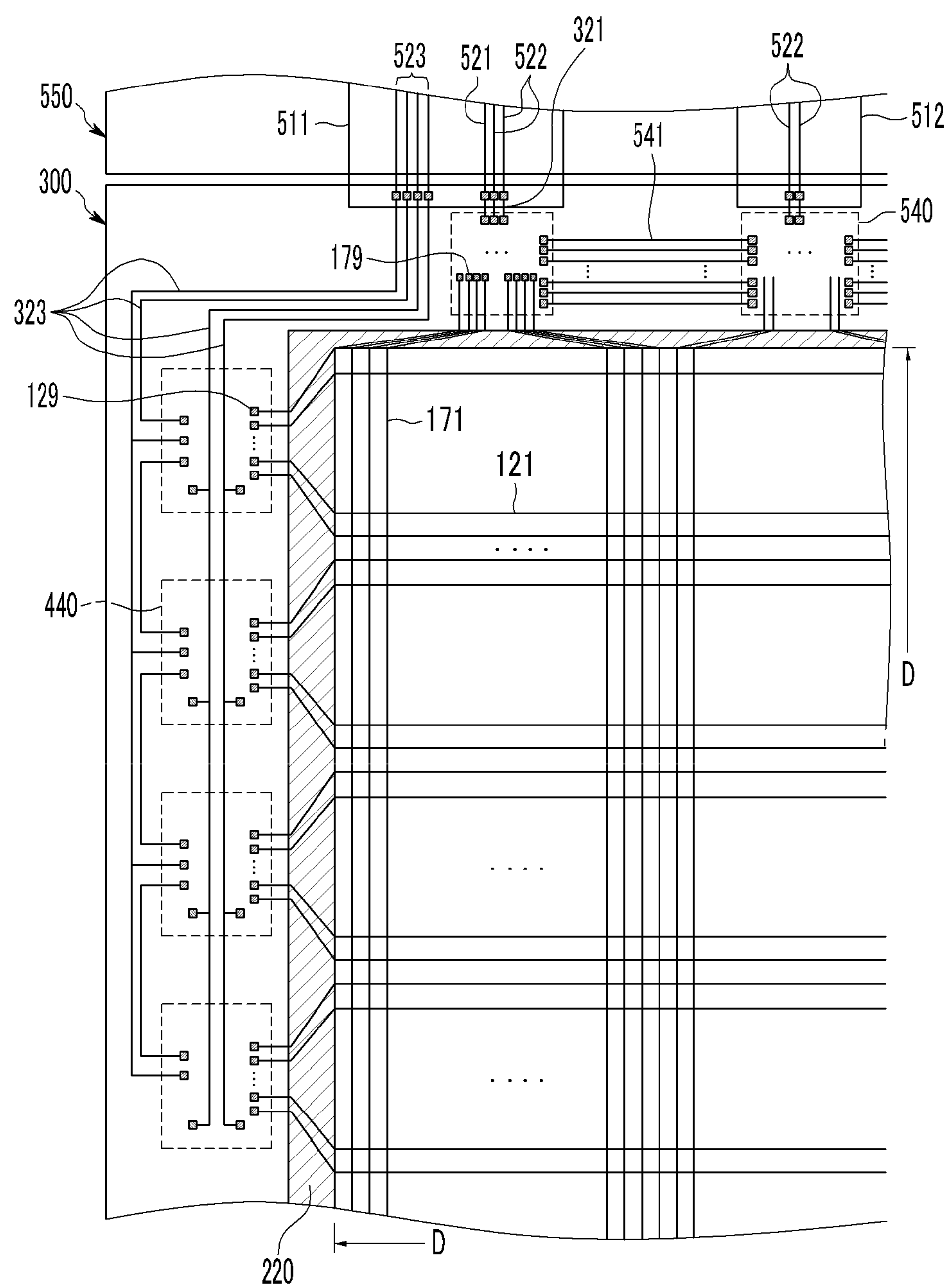
FIG. 1 is a layout view of a liquid crystal display according to an exemplary embodiment of the present invention.

The invention is described more fully hereinafter with reference to the accompanying drawings, in which exemplary embodiments of the invention are shown. However, this invention is not limited to the exemplary embodiments described herein, but may be embodied in many different forms. Rather, these exemplary embodiments described herein are provided so that this disclosure is thorough, and will fully convey the scope of the invention to those skilled in the art. In the drawings, the size and relative sizes of layers and regions may be exaggerated for clarity.

It is to be noted that when an element or layer is referred to as being "on" or "connected to" another element or layer, it can be formed directly on or directly connected to the other element or layer, or intervening elements or layers may be present. In contrast, when an element or layer is referred to as being "directly on" or "directly connected to" another element or layer, there are no intervening elements or layers present. Like reference numerals in the drawings denote like elements.

FIG. 1 is a layout view of a liquid crystal display according to an exemplary embodiment of the present invention.

As shown in FIG. 1, a liquid crystal display according to an exemplary embodiment of the present invention includes a liquid crystal panel assembly 300 including a lower panel (not shown) and an upper panel (not shown) facing each other and a liquid crystal layer (not shown) interposed therebetween, a printed circuit board (PCB) 550 including a circuit element such as a signal controller, a driving voltage generator, and a gray voltage generator to drive the liquid crystal display, and flexible printed circuit boards (FPCB) 511 and 512 electrically and physically connecting the liquid crystal panel assembly 300 and the PCB 550 to each other.

The liquid crystal panel assembly 300 includes gate lines 121 extending in a transverse direction and data lines 171 extending in a longitudinal direction. The liquid crystal panel assembly 300 is divided into a display area D including a plurality of pixel areas defined by the intersection of the gate lines 121 and the data lines 171 to display images, and a region outside the display area D that is a peripheral area. A black matrix 220 (slashed portion) is formed outside the display area D, thereby preventing light leakage into the peripheral area. The gate lines 121 are substantially parallel to each other and the data lines 171 are substantially parallel to each other, inside the display area D. However, the gate lines 121 are collectively positioned on one portion and grouped into fan-like shapes in a "fan-out" area as they leave the display area D. They then again become substantially parallel to each other. Likewise, the data lines 171 are collectively positioned on one portion, grouped into fan-like shapes in a fan-out area as they leave the display area D, and are then substantially parallel to each other beyond the fan-out area.

A plurality of data driving integrated circuits (ICs) 540 to apply data signals to the data lines 171 by selecting a gray voltage and connected to data pads 179 connected to the data lines 171 are sequentially mounted in the transverse direction on the upper side outside the display area D of the liquid crystal panel assembly 300. Connection lines 541 are formed between the data driving ICs 540, and a carry signal supplied through the FPCB 511 to the data driving IC 540 disposed on the leftmost side is sequentially transmitted to the next data driving IC 540 through the connection lines 541.

On the left side of the liquid crystal panel assembly 300, a plurality of gate driving ICs 440 connected to gate pads 129 connected to the gate lines 121 and applying gate signals including a gate-on voltage and a gate-off voltage to the gate lines 121 are formed in the longitudinal direction. A plurality of driving signal lines 323 are formed near the gate driving IC 440. The driving signal line 323 electrically connects between a driving signal line 523 of the FPCB 511 and the gate driving IC 440, or the gate driving ICs 440. Here, the gate driving IC 440 may be directly formed on a substrate 110 (FIG. 3) along with a switching element or the driving signal line 323, thereby having a structure including a plurality of thin film transistors or signal lines.

In the FPCB 511, data transmitting lines 521 and driving signal lines 522 and 523 are connected to the circuit element of the PCB 550 to receive signals from the circuit element of the PCB 550. The data transmitting line 521 is connected to an input terminal of the data driving IC 540 through a lead line 321 formed in the liquid crystal panel assembly 300, thereby transmitting a gray signal. The driving signal lines 522 and 523 transmit a power voltage and control signals for the operation of the data driving ICs 540 and the gate driving ICs 440 to the data driving IC 540 and the gate driving IC 440 through the lead line 321 and the driving signal line 323 formed in the liquid crystal panel assembly 300.

In the other FPCB 512, a plurality of driving signal lines 522 to transmit driving signals and control signals to the data driving IC 540 connected thereto are formed. On the other hand, the driving signal line 523 may be formed in an additional FPCB.

As described above, the liquid crystal panel assembly 300 includes two display panels (not shown), and the lower panel, which includes thin film transistors, is referred to as "a thin film transistor array panel". Next, a structure of the thin film transistor array panel is described with reference to FIG. 2, FIG. 3, FIG. 4 and FIG. 5.

Figure 2:
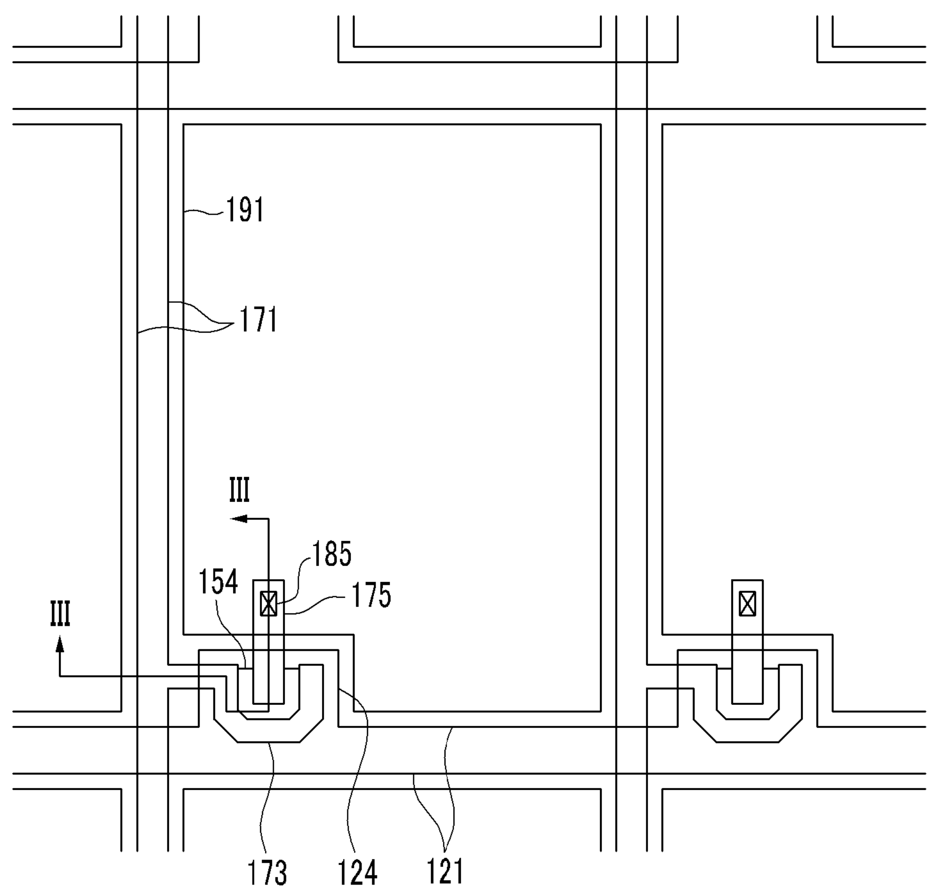
FIG. 2 is a layout view of a thin film transistor array panel according to an exemplary embodiment of the present invention.
Figure 3:
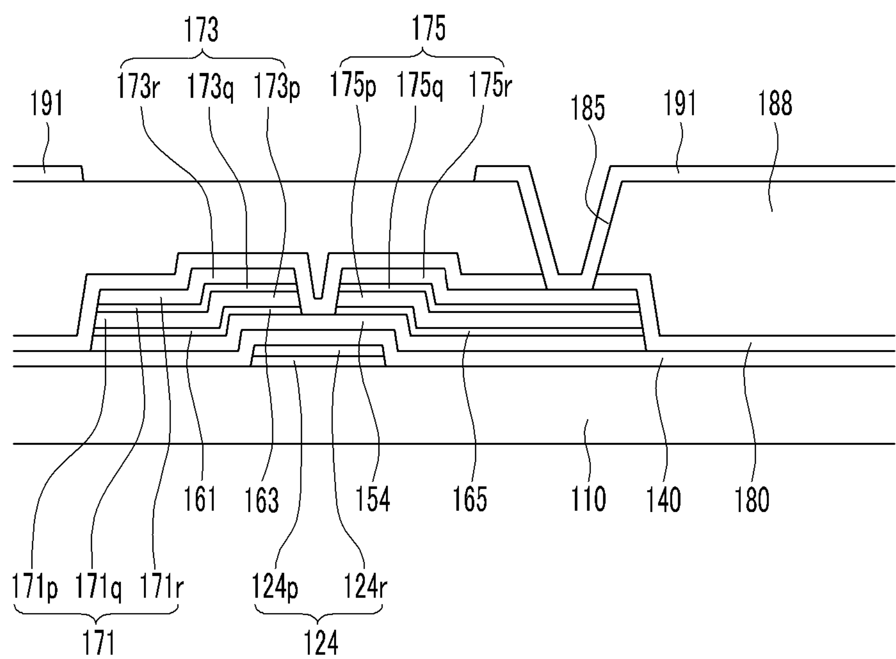
FIG. 3 is a cross-sectional view of the thin film transistor array panel of FIG. 2 taken along line III-III.
Figure 4:
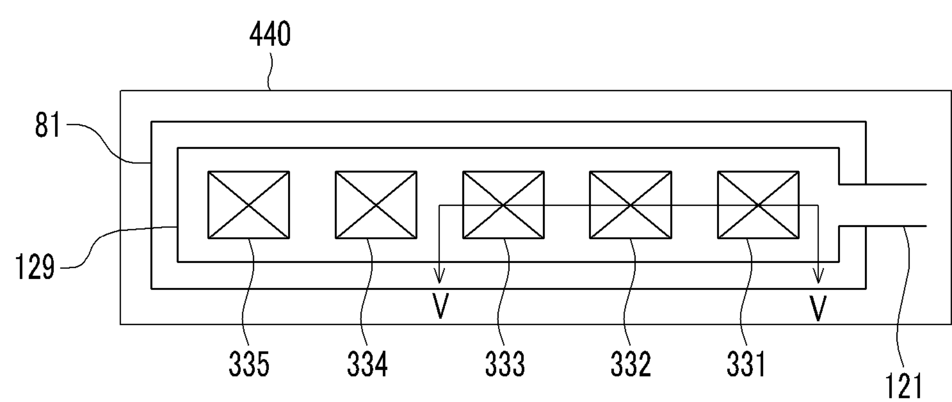
FIG. 4 is an enlarged layout view of a gate pad according to an exemplary embodiment of the present invention.
Figure 5:
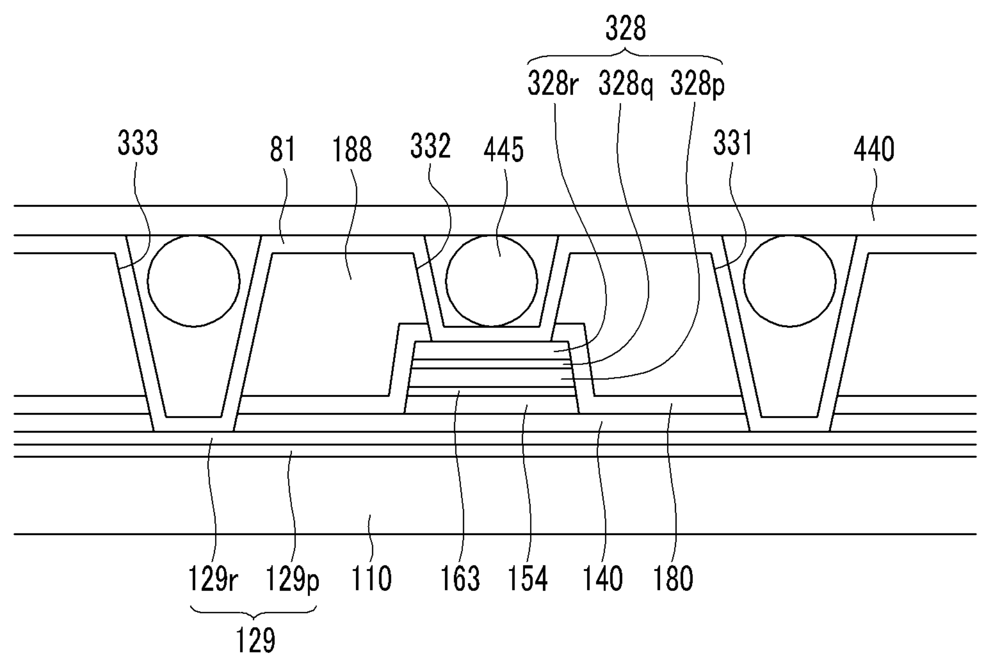
FIG. 5 is a cross-sectional view taken along line V-V of FIG. 4.

FIG. 2 is a layout view of a thin film transistor array panel according to an exemplary embodiment of the present invention, FIG. 3 is a cross-sectional view of the thin film transistor array panel of FIG. 2 taken along line III-III, FIG. 4 is an enlarged layout view of a gate pad 129 shown in FIG. 1, and FIG. 5 is a cross-sectional view taken along the line V-V of FIG. 4.

As shown in FIG. 2 and FIG. 3, in the thin film transistor array panel, a gate line 121 is formed on a substrate 110 made of an insulating material such as glass or plastic. A gate insulating layer 140, a semiconductor 154, ohmic contact layers 163 and 165, and a data line 171 and a drain electrode 175 are sequentially formed thereon.

The gate line 121 transmits gate signals and includes a plurality of gate electrodes 124 protruding upward. The gate line 121 includes a lower layer **124*p* made of an aluminum-containing metal such as aluminum (Al) or an aluminum alloy, and an upper layer 124*r*** made of a molybdenum-containing metal such as molybdenum (Mo) or a molybdenum alloy.

The data line 171 transmits data signals and crosses the gate line 121. The data line 171 includes a source electrode 173 extending toward the gate electrode 124. The drain electrode 175 is separated from the data line 171 and is opposite to the source electrode 173 with respect to the gate electrode 124.

The data line 171, the source electrode 173, and the drain electrode 175 have a three-layered structure that includes lower layers **171*p*, 173*p*, and 175*p*, intermediate layers 171*q*, 173*q*, and 175*q*, and upper layers 171*r*, 173*r*, and 175*r*, respectively. The lower layers 171*p*, 173*p*, and 175*p* are made of pure molybdenum or a molybdenum-based metal, such as a molybdenum alloy including molybdenum nitride (MoN), molybdenum-niobium (MoNb), molybdenum-vanadium (MoV), molybdenum-titanium (MoTi), molybdenum-tungsten (MoW), and the like. The intermediate layers 171*q*, 173*q*, and 175*q* are made of aluminum or aluminum-neodymium (AlNd) having low resistivity. The upper layers 171*r*, 173*r*, and 175*r*** are made of pure molybdenum or a molybdenum-based metal, such as a molybdenum alloy including molybdenum nitride (MoN), molybdenum-niobium (MoNb), molybdenum-vanadium (MoV), molybdenum-titanium (MoTi), molybdenum-tungsten (MoW), and the like, having excellent contact characteristics with ITO or IZO.

Also, the gate line 121, the data line 171, and the drain electrode 175 may be formed of a single layer.

The semiconductor 154 is disposed on the gate electrode 124, and the ohmic contact layers 163 and 165 thereof are disposed between the semiconductor 154, and the data line 171 and the drain electrode 175, thereby reducing contact resistance therebetween.

A gate electrode 124, a source electrode 173, a drain electrode 175, and the semiconductor 154 form a thin film transistor (TFT), and a channel of the thin film transistor is formed in the semiconductor 154 between the source electrode 173 and the drain electrode 175.

A passivation layer 180 made of silicon nitride or silicon oxide is formed on the gate insulating layer 140, the data line 171, and the drain electrode 175, and an insulating layer 188 having an excellent planarization characteristic and made of an organic material is formed on the passivation layer 180. The passivation layer 180 and the insulating layer 188 have a contact hole 185 exposing the drain electrode 175.

A pixel electrode 191 connected to the drain electrode 175 through the contact hole 185 and made of a transparent conductive material such as ITO or IZO is formed on the insulating layer 188.

As shown in FIG. 4 and FIG. 5, a first contact portion 331, a second contact portion 332, a third contact portion 333, a fourth contact portion 334 and a fifth contact portion 335 connected to the gate pad 129 and the gate driving IC 440 are formed. FIG. 5 only shows the first contact portion 331, the second contact portion 332 and the third contact portion 333, however the fourth contact portion 334 has the same structure as that of the second contact portion 332, and the fifth contact portion 335 has the same structure as that of the first contact portion 331 and the third contact portion 333.

The gate pad 129 is formed on the substrate 110, is connected to the gate line 121, and has a wider area than the gate line 121 for the connection with the gate driving IC 440.

This gate pad 129 includes a lower layer **129*p* made of an aluminum-based metal such as aluminum (Al) or aluminum alloy and an upper layer 129*r* made of a molybdenum-based metal such as molybdenum (Mo) or a molybdenum alloy, like the gate line 121**.

The gate insulating layer 140, the semiconductor 154, the ohmic contact layer 163, a height controlling member 328, the passivation layer 180, the insulating layer 188, and a contact assistant 81 are sequentially formed on the gate pad 129. Here, the height controlling member 328 is only formed in the second contact portion 332 and the fourth contact portion 334, and is not formed in the first contact portion 331, the third contact portion 333, and the fifth contact portion 335. Also, the semiconductor 154 and the ohmic contact layer 163 are formed between the height controlling member 328 and the gate insulating layer 140.

The height controlling member 328 is formed with the same layer as the data line 171, and has a three-layered structure including a lower layer **328*p*, an intermediate layer 328*q*, and an upper layer 328*r*. The lower layer 328*p* is made of pure molybdenum or a molybdenum-based metal, such as a molybdenum alloy including molybdenum nitride (MoN), molybdenum-niobium (MoNb), molybdenum-vanadium (MoV), molybdenum-titanium (MoTi), molybdenum-tungsten (MoW), and the like. The intermediate layer 328*q* is made of aluminum or aluminum-neodymium (AlNd) having low resistivity. The upper layer 328*r*** is made of pure molybdenum or a molybdenum-based metal, such as a molybdenum alloy including molybdenum nitride (MoN), molybdenum-niobium (MoNb), molybdenum-vanadium (MoV), molybdenum-titanium (MoTi), molybdenum-tungsten (MoW), and the like, having excellent contact characteristics with ITO or IZO.

The contact assistant 81 is formed with the same layer as the pixel electrode 191, and is made of the transparent conductive material such as ITO or IZO.

The first contact portion 331, the third contact portion 333, and the fifth contact portion 335 are formed in the gate insulating layer 140, the passivation layer 180, and the insulating layer 188 and expose the gate pad 129, and the gate pad 129 contacts the contact assistant 81 through the first contact portion 331, the third contact portion 333, and the fifth contact portion 335.

The second contact portion 332 and the fourth contact portion 334 are formed in the passivation layer 180 and the insulating layer 188 and expose the height controlling member 328, and the height controlling member 328 and the contact assistant 81 contact each other through the second contact portion 332 and the fourth contact portion 334.

The gate pad 129 contacts the gate driving IC 440 through the first contact portion 331, the second contact portion 332, the third contact portion 333, the fourth contact portion 334 and the fifth contact portion 335. On the other hand, conductive balls 445 are formed in the gate driving IC 440. Due to the size of the conductive balls 445, they do not make contact between the gate driving IC 440 and the contact assistant 81 in the first contact portion 331, the third contact portion 333, and the fifth contact portion 335, but they do make contact between the gate driving IC 440 and the contact assistant 81 in the second contact portion 332 and the fourth contact portion 334 including the height controlling member 328.

The second contact portion 332 and the fourth contact portion 334 and the first contact portion 331, the third contact portion 333, and the fifth contact portion 335 are connected by the contact assistant 81 such that the gate driving IC 440 and the gate pad 129 are connected to each other through the contact assistant 81 even if the conductive balls 445 of the gate driving IC 440 only contact between the gate driving IC 440 and the contact assistant 81 in the second contact portion 332 and the fourth contact portion 334.

In an exemplary embodiment of the present invention, five contact portions are shown, however the number of contact portions may be more than five, and the arrangements of the contact portions including the height controlling member may be various.

Next, a manufacturing method of a thin film transistor array panel shown in FIG. 2, FIG. 3, FIG. 4 and FIG. 5 will be described with reference to FIG. 6, FIG. 7, FIG. 8, FIG. 9 and FIG. 10. FIG. 6, FIG. 7, FIG. 8, FIG. 9 and FIG. 10 are views sequentially showing a manufacturing method of the thin film transistor array panel shown in FIG. 2, FIG. 3, FIG. 4 and FIG. 5.

Figure 6:
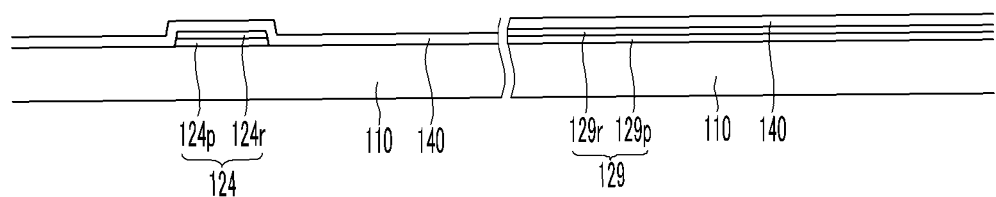
FIG. 6, FIG. 7, FIG. 8, FIG. 9 and FIG. 10 are views sequentially showing a manufacturing method of the thin film transistor shown in FIG. 2, FIG. 3, FIG. 4 and FIG. 5.

Firstly, as shown in FIG. 6, a gate line 121 including a gate electrode 124 and a gate pad 129 connected to the gate line 121 are formed on a substrate 110, and a gate insulating layer 140 is formed on the gate line 121, the gate electrode 124 and the gate pad 129.

Figure 7:
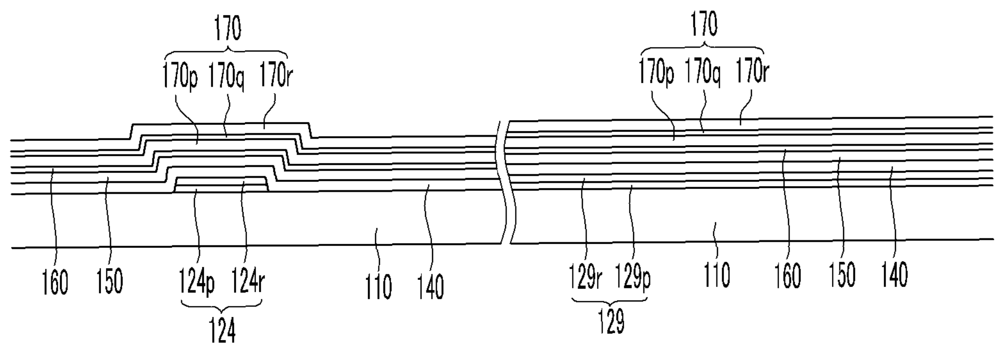

Next, as shown in FIG. 7, an amorphous silicon layer 150, an amorphous silicon layer 160 doped with an impurity, and a data metal layer 170 including a lower molybdenum layer **170*p* made of the molybdenum-based metal, an intermediate aluminum layer 170*q* made of the aluminum-based metal, and an upper molybdenum layer 170*r* made of the molybdenum-based metal are sequentially formed on the gate insulating layer 140**.

Figure 8:
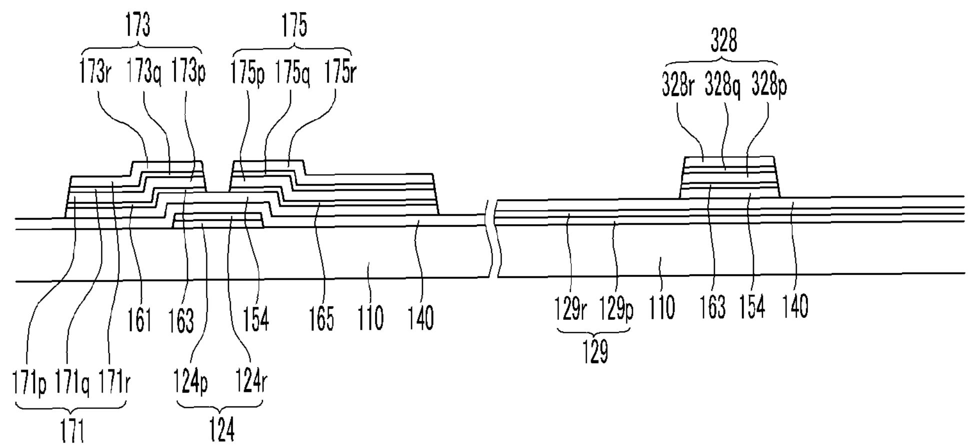

Next, as shown in FIG. 8, the amorphous silicon layer 150, the amorphous silicon layer 160 doped with the impurity, and the data metal layer 170 are etched by using one mask to form a semiconductor 154, ohmic contact layers 163 and 165, a data line 171 including a source electrode 173 and a drain electrode 175, and a height controlling member 328. Here, the height controlling member 328 corresponds to the gate pad 129.

Figure 9:
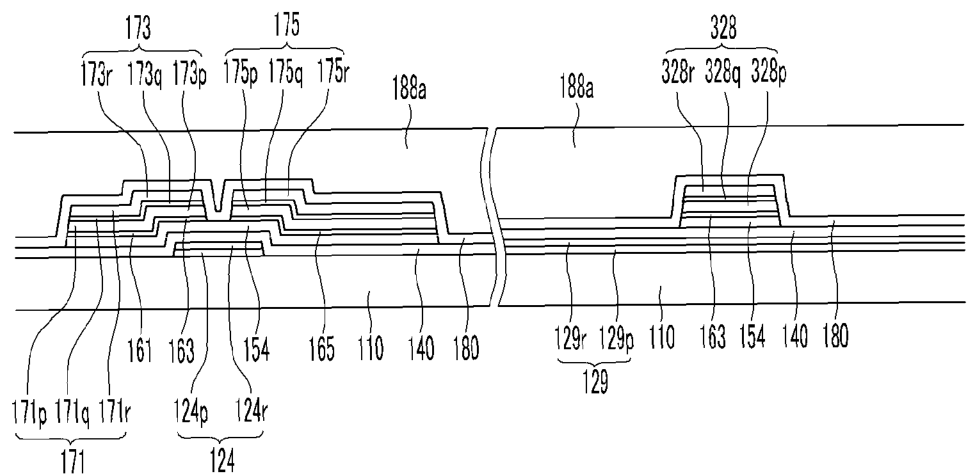
Figure 10:
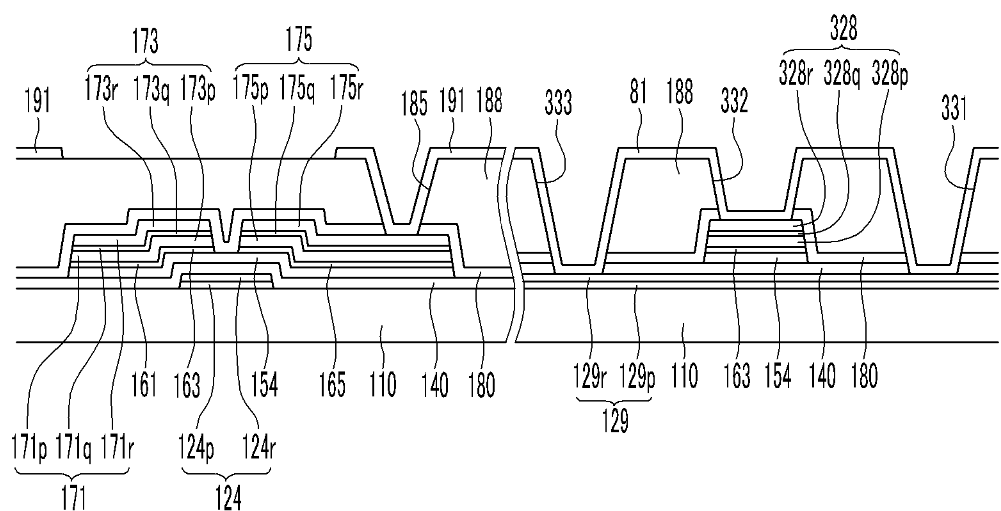

Next, as shown in FIG. 9 and FIG. 10, a passivation layer 180 and an insulating layer 188 are sequentially formed on the gate insulating layer 140, the data line 171, the drain electrode 175, and the height controlling member 328, and are patterned to form a contact hole 185 exposing the drain electrode 175, the first contact portion 331, the third contact portion 333, and the fifth contact portion 335 exposing the gate pad 129, and the second contact portion 332 and the fourth contact portion 334 exposing the height controlling member 328.

Next, a pixel electrode 191 connected to the drain electrode 175 and a contact assistant 81 connected to the gate pad 129 and the height controlling member 328 are formed on the insulating layer 188.

According to exemplary embodiments of the present invention, the contact portion including the height controlling member is formed such that the contact reliability between a gate driving IC and a gate pad may be ensured in the contact portion.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:

a substrate comprising a display area and a peripheral area;

a gate line disposed on the substrate;

a gate driver disposed in the peripheral area of the substrate to supply a gate signal to the gate line;

a gate pad disposed on the substrate connecting the gate line to the gate driver;

a gate insulating layer disposed on the gate line and the gate pad;

a data line disposed on the gate insulating layer and comprising a source electrode;

a drain electrode facing the source electrode;

a height controlling member disposed on the gate insulating layer and in a location corresponding to the gate pad;

a passivation layer disposed on the gate insulating layer, the data line, the drain electrode, the gate pad, and the height controlling member;

an insulating layer disposed on the passivation layer;

a pixel electrode disposed on the insulating layer and connected to the drain electrode; and a contact assistant connected to the gate pad and the height controlling member, wherein the height controlling member is disposed between the gate insulating layer and the contact assistant.

2. The thin film transistor array panel of claim 1, further comprising:

a first contact portion disposed in the peripheral area, wherein the contact assistant is connected to the gate pad through the first contact portion; and a second contact portion disposed in the peripheral area, wherein the contact assistant is connected to the height controlling member through the second contact portion.

3. The thin film transistor array panel of claim 2, wherein a plurality of first contact portions and second contact portions are formed, and the first contact portions and the second contact portions are alternately disposed.

4. The thin film transistor array panel of claim 3, wherein the first contact portions are formed in the gate insulating layer, the passivation layer, and the insulating layer, and the second contact portions are formed in the passivation layer and the insulating layer.

5. The thin film transistor array panel of claim 4, wherein the height controlling member comprises the same material as the data line and the same layer as the data line.

6. The thin film transistor array panel of claim 5, further comprising:

a semiconductor and an ohmic contact layer disposed on the gate insulating layer and between the height controlling member and the gate insulating layer.

7. The thin film transistor array panel of claim 6, wherein the insulating layer comprises an organic material.

8. The thin film transistor array panel of claim 7, wherein the contact assistant comprises the same material as the pixel electrode and the same layer as the pixel electrode.

9. The thin film transistor array panel of claim 8, wherein the gate pad comprises the same material as the gate line and the same layer as the gate line.

10. The thin film transistor array panel of claim 1, wherein the height controlling member comprises the same material as the data line and the same layer as the data line.

11. The thin film transistor array panel of claim 10, further comprising:

a semiconductor and an ohmic contact layer disposed on the gate insulating layer and between the height controlling member and the gate insulating layer.

12. The thin film transistor array panel of claim 11, wherein the insulating layer comprises an organic material.

13. The thin film transistor array panel of claim 12, wherein the contact assistant comprises the same material as the pixel electrode and the same layer as the pixel electrode.

14. The thin film transistor array panel of claim 13, wherein the gate pad comprises the same material as the gate line and the same layer as the gate line.

15. The thin film transistor array panel of claim 1, further comprising:

a semiconductor and an ohmic contact layer disposed on the gate insulating layer and between the height controlling member and the gate insulating layer.

16. The thin film transistor array panel of claim 15, wherein the insulating layer comprises an organic material.

17. The thin film transistor array panel of claim 16, wherein the contact assistant comprises the same material as the pixel electrode and the same layer as the pixel electrode.

18. The thin film transistor array panel of claim 17, wherein the gate pad comprises the same material as the gate line and the same layer as the gate line.

19. The thin film transistor array panel of claim 1, wherein a first portion of the contact assistant is connected to the gate pad via a first contact hole in the gate insulating layer, the passivation layer, and the insulating layer, and a second portion of the contact assistant is connected to the height controlling member via a second contact hole in the passivation layer and the insulating layer.

20. The thin film transistor array panel of claim 19, wherein the first portion of the contact assistant is disposed at a first height above the substrate, the second portion of the contact assistant is disposed at a second height above the substrate, and the second height exceeds the first height.

21. The thin film transistor array panel of claim 1, wherein a first portion of the contact assistant is connected to the gate pad via a first contact hole, and a second portion of the contact assistant is connected to the height controlling member via a second contact hole different from the first contact hole.

22. The thin film transistor array panel of claim 21, wherein the first contact hole extends a first depth, the second contact hole extends a second depth, and the first depth exceeds the second depth.

* * * * *